United States Patent
Xu et al.

(10) Patent No.: US 10,892,377 B2
(45) Date of Patent: Jan. 12, 2021

(54) SELECTIVE DEPOSITION FOR INTERDIGITATED PATTERNS IN SOLAR CELLS

(71) Applicants: IMEC VZW, Leuven (BE); Katholieke Universiteit Leuven, KU LEUVEN R&D, Leuven (BE)

(72) Inventors: Menglei Xu, Leuven (BE); Twan Bearda, Mechelen (BE); Hariharsudan Sivaramakrishnan Radhakrishnan, Leuven (BE); Jef Poortmans, Kessel-Lo (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 33 days.

(21) Appl. No.: 16/540,880

(22) Filed: Aug. 14, 2019

(65) Prior Publication Data

US 2020/0091368 A1    Mar. 19, 2020

(30) Foreign Application Priority Data

Sep. 13, 2018 (EP) ..................... 18194175

(51) Int. Cl.
  *H01L 31/18* (2006.01)
  *H01L 31/0224* (2006.01)
  (Continued)

(52) U.S. Cl.
  CPC .... *H01L 31/1868* (2013.01); *H01L 31/02167* (2013.01); *H01L 31/022441* (2013.01);
  (Continued)

(58) Field of Classification Search
  None
  See application file for complete search history.

(56) References Cited

U.S. PATENT DOCUMENTS

2012/0060914 A1    3/2012  Hsu et al.
2019/0371946 A1*   12/2019 Sivaramakrishnan
                            Radhakrishnan ..... H01L 31/202

OTHER PUBLICATIONS

European Search Report, European Patent Application No. 18194175. 8, dated Feb. 27, 2019, 8 pages.
(Continued)

*Primary Examiner* — Steven B Gauthier
(74) *Attorney, Agent, or Firm* — McDonnell Boehnen Hulbert & Berghoff LLP

(57) ABSTRACT

Example embodiments relate to selective deposition for interdigitated patterns in solar cells. One embodiment includes a method for creating an interdigitated pattern for a solar cell. The method includes providing a substrate of the solar cell. A surface of the substrate includes one or more exposed regions and one or more regions covered by a patterned first passivation layer stack protected by a hard mask. The method also includes selectively depositing a second passivation layer stack that includes at least a first layer of amorphous silicon (a-Si) on the one or more exposed regions such that the first passivation layer stack and the second passivation layer stack form the interdigitated pattern. Selectively depositing the second passivation layer stack includes adding a sublayer of the first layer on the hard mask, etching the added sublayer on the hard mask, and cleaning a surface of the remaining added sublayer.

15 Claims, 3 Drawing Sheets

(51) Int. Cl.
   *H01L 31/0216*  (2014.01)
   *H01L 31/0747*  (2012.01)
   *H01L 31/20*    (2006.01)

(52) U.S. Cl.
   CPC ...... *H01L 31/0747* (2013.01); *H01L 31/1804* (2013.01); *H01L 31/202* (2013.01); *Y02E 10/547* (2013.01); *Y02P 70/50* (2015.11)

(56) References Cited

OTHER PUBLICATIONS

Louwen, Atse, et al., "A Cost Roadmap for Silicon Heterojunction Solar Cells", Solar Energy Materials and Solar Cells, vol. 147, Jan. 15, 2016, pp. 295-314.

Scherff, Maximilian, "Novel Methode for Preparation of Interdigitated Back Contacted a-Si:H/c-Si Heterojunction Solar Cells", 26th European Photovoltaic Solar Energy Conference and Exhibition, Oct. 13, 2011, pp. 2125-2129.

* cited by examiner

FIG. 1F          FIG. 1G

SELECTIVE DEPOSITION FOR INTERDIGITATED PATTERNS IN SOLAR CELLS

CROSS-REFERENCE TO RELATED APPLICATIONS

The present application is a non-provisional patent application claiming priority to European Patent Application No. EP 18194175.8, filed Sep. 13, 2018, the contents of which are hereby incorporated by reference.

FIELD OF THE DISCLOSURE

The present disclosure relates to the field of production of solar cells. In particular, the present disclosure relates to a method for creating an interdigitated pattern for a solar cell using selective deposition of amorphous silicon.

BACKGROUND

Silicon solar cells of e.g. heterojunction interdigitated back-contact (HJ-IBC) type may provide a high energy conversion efficiency. To extract the charge carriers in back-contact solar cells, the rear side of such cells is patterned into interdigitated strips or patterns of electron and hole contacts.

The creation of such rear-side interdigitated patterns may however be complex and present an obstacle towards commercialization of the solar cells. Processes based on photolithography and/or lift-off may be both costly and hard to adapt for mass production outside of the laboratory.

There is therefore a need for an improved patterning process for such solar cells.

SUMMARY

To at least partly satisfy the above need, the present disclosure provides a method for creating an interdigitated pattern for a solar cell as defined in the independent claim. Further embodiments of the method are defined in the dependent claims.

According to an aspect of the present disclosure, a method for creating an interdigitated pattern for a solar cell is provided. The method may include providing a substrate of the solar cell. A surface of the substrate may include one or more exposed regions and one or more regions covered by a patterned first passivation layer stack. The patterned first passivation layer stack may be protected by a hard mask. The method may include selectively depositing a second passivation layer stack including at least a first layer of amorphous silicon (a-Si, or a-Si:H) on the one or more exposed regions (of the surface of the substrate), such that the first passivation layer stack and the second passivation layer stack may form the interdigitated pattern. Selectively depositing the second passivation layer stack may include a step (1a) of adding/depositing, using a plasma deposition process, a sublayer of the first layer (of a-Si) on the hard mask and in the one or more exposed regions (of the surface). Selectively depositing the second passivation layer stack may include a step (1b) of etching, using a plasma etch process, the added sublayer (of the first layer of a-Si) on the hard mask and in the one or more exposed regions. An etch rate of the added sublayer on the hard mask may be higher than an etch rate of the added sublayer in the one or more exposed regions, thereby substantially removing the added sublayer (of the first layer) from the hard mask and leaving a finite thickness of the added sublayer (of the first layer) in the one or more exposed regions. Phrased differently, the etching of the added sublayer on the hard mask may be faster than the etching of the added sublayer in the one or more exposed regions, such that, at the time all or substantially all of the added sublayer is etched away from the hard mask, at least a part (having a finite thickness) of the added sublayer remains in the one or more exposed regions. Selectively depositing the second passivation layer stack may further include a step (1c) of cleaning, using a plasma cleaning process, a surface of the remaining added sublayer in the one or more exposed regions from contaminants (which may be) remaining from the plasma etch process of step 1b, and adding a further sublayer of the first layer in the one or more exposed regions by repeating the steps 1a and 1b. The step 1c (i.e. the cleaning of a sublayer and addition/deposition and etching of an additional sublayer) may be repeated until a desired thickness of the first layer in/on the one or more exposed regions is obtained Herein, a "sublayer" of a layer may, during the execution of the method, at times have an extension which differs from that of the final layer. For example, the added sublayer may at times cover also the hard mask, although the final first layer will substantially, due to the selective deposition, only cover the one or more exposed regions (of the surface of the substrate). This is achieved by the different etch rates, which will allow to completely or at least almost completely remove any part of the first layer which during the execution of the method is added/deposited over the hard mask (i.e. provide a selective deposition of the first layer and the second passivation layer stack only on the one or more exposed regions). Further, that a sublayer is added/deposited "in" the one or more regions means that it may sometimes be added/deposited directly on the exposed surface of the substrate, but also instead on another sublayer which was added/deposited during a previous iteration. Phrased differently, the first sublayer may be added directly on an exposed surface of the substrate, while e.g. a second, third, . . . , sublayer may instead be added on a previously added sublayer and not directly on the surface of the substrate.

In addition to obtaining selective deposition of the materials for the second passivation layer stack, the step of cleaning the etched sublayer may further improve surface passivation of the surface of the substrate covered by the second passivation layer stack, resulting in an increased lifetime for e.g. minority carriers in the substrate. Meanwhile, the use of the plasma cleaning process (in contrast to e.g. an external HF dip) may allow to perform such cleaning in-situ without breaking a vacuum, and by using for example a same plasma chamber as the one used for the etching step. This while still maintaining a sufficient lifetime.

In some embodiments, the method may further include thermally annealing the first layer after obtaining the desired thickness of the first layer in/on the one or more exposed regions. Thermally annealing the first layer may help to improve the surface passivation quality of the first layer of a-Si, which may result in a further increase of the lifetime for e.g. minority carriers in the substrate.

In some embodiments, a temperature of such a thermal annealing may be from 200 to 250° C.

In some embodiments, after etching in step 1b, the finite thickness of the remaining added sublayer in the one or more exposed regions may be 2 nm or less. Phrased differently, each iteration of cleaning, deposition and etching may cause the thickness of the first layer to increase with at most 2 nm.

In some embodiments, after etching in step 1b, the finite thickness of the remaining added sublayer in the one or more exposed regions may be 0.5 nm or more. Phrased differently, each iteration may cause the thickness of the first layer to increase with at least 0.5 nm.

In some embodiments, the plasma deposition process (used in step 1a) may include delaying deposition of a-Si until after the plasma has been ignited. Delaying the deposition of a-Si until after the ignition phase of the plasma may further enhance the surface passivation quality. Phrased differently, the surface passivation quality may be improved by preventing a majority of the a-Si deposited on e.g. the surface of the substrate from being deposited mainly during the ignition phase. This may include reducing a concentration of Si—$H_2$ which may be formed during deposition during the ignition phase, and which may have detrimental impact on passivation quality. This may be achieved by depositing the a-Si only at lower power, i.e. after the initial high-powered ignition phase of the plasma deposition process.

In some embodiments, such delaying may be from 1 to 5 seconds.

In some embodiments, the plasma deposition process (used in step 1a) may include using a $SiH_4$ (silane) precursor.

In some embodiments, the desired thickness of the first layer in the one or more exposed regions may be from 3 to 10 nm. Such a thickness may correspond well to a desired thickness for the first layer in the first passivation layer stack of a solar cell.

In some embodiments, the plasma etch process (used in step 1b) may include using a precursor selected from the group consisting of: $NF_3/Ar$, $CF_x$, $HB_r/Cl_2$, $HBr/O_2$, and $SF_6/O_2$. Using for example an $NF_3/Ar$ precursor may help to avoid etching induced defects, and/or avoid an induced defective epi-Si layer (e.g. polycrystalline silicon) which may be caused by other precursors such as e.g. $H_2$.

In some embodiments, a time duration of the cleaning (in step 1c) may be from 10 to 30 seconds.

In some embodiments, a power density used for the cleaning (in step 1c) may be at least 90 $mW/cm^2$.

In some embodiments, the plasma cleaning process (used in step 1c) may include using a precursor selected from the group consisting of: $H_2$, Ar, $N_2O/NH_3$, and $O_2/NH_3$.

In some embodiments, the first layer of a-Si may be a first layer of intrinsic a-Si (or a-Si:H). The second passivation layer stack may include a second layer of doped a-Si (or a-Si:H). The selective depositing of the second passivation layer stack may further include a step (2a) of adding/depositing, using a plasma deposition process, a sublayer of the second layer on the hard mask and on the first layer in the one or more exposed regions. The selective depositing of the second passivation layer stack may include a step (2b) of etching, using a plasma etch process, the added sublayer of the second layer on the hard mask and on the first layer in the one or more exposed region. An etch rate of the added sublayer of the second layer on the hard mask may be higher than an etch rate of the added sublayer of the second layer on the first layer in the one or more exposed regions, thereby substantially removing the added sublayer of the second layer from the hard mask and leaving a finite thickness of the added sublayer of the second layer on the first layer in the one or more exposed regions. The selective depositing of the second passivation layer stack may include a step (2c) of cleaning, using a plasma cleaning process, a surface of the remaining added sublayer of the second layer on the first layer in/on the one or more exposed regions from contaminants remaining from the plasma etch process (in step 2b), and adding a further sublayer of the second layer on the first layer in the one or more exposed regions by repeating steps 2a and 2b. The step 2c may be repeated until a desired thickness of the second layer on the first layer in the one or more exposed regions has been obtained. Phrased differently, the method may include (using the same or a similar process as used to selectively add the first layer) adding also a second layer on (top of) the first layer. The first (intrinsic) layer and the second (doped) layer of a-Si (or a-Si:H) may form the second passivation layer stack. The doping of the second layer may for example be of a type (p- or n-doped) opposite to that of the doped a-Si layer of the first passivation layer stack.

In some embodiments, the desired thickness of the second layer (on the first layer in the one or more exposed regions) may be from 5 to 35 nm. Such a thickness may correspond well to a desired thickness of the doped a-Si layer in the second passivation layer stack for a solar cell.

The present disclosure relates to all possible combinations of features mentioned herein, including the ones listed above as well as other features which will be described in what follows with reference to different embodiments. Any embodiment described herein may be combinable with other embodiments also described herein, and the present disclosure relates also to all such combinations. For example, all limitations specified herein with reference to the steps of selectively adding/depositing the first layer of the second passivation layer stack may apply also to the steps of selectively adding/depositing also the second layer of the second passivation layer stack, if such a second layer is to be added.

BRIEF DESCRIPTION OF THE DRAWINGS

Example embodiments will be described below with reference to the accompanying drawings, in which FIG. 1A schematically illustrates a flowchart of a method, according to example embodiments.

Figure 1A:
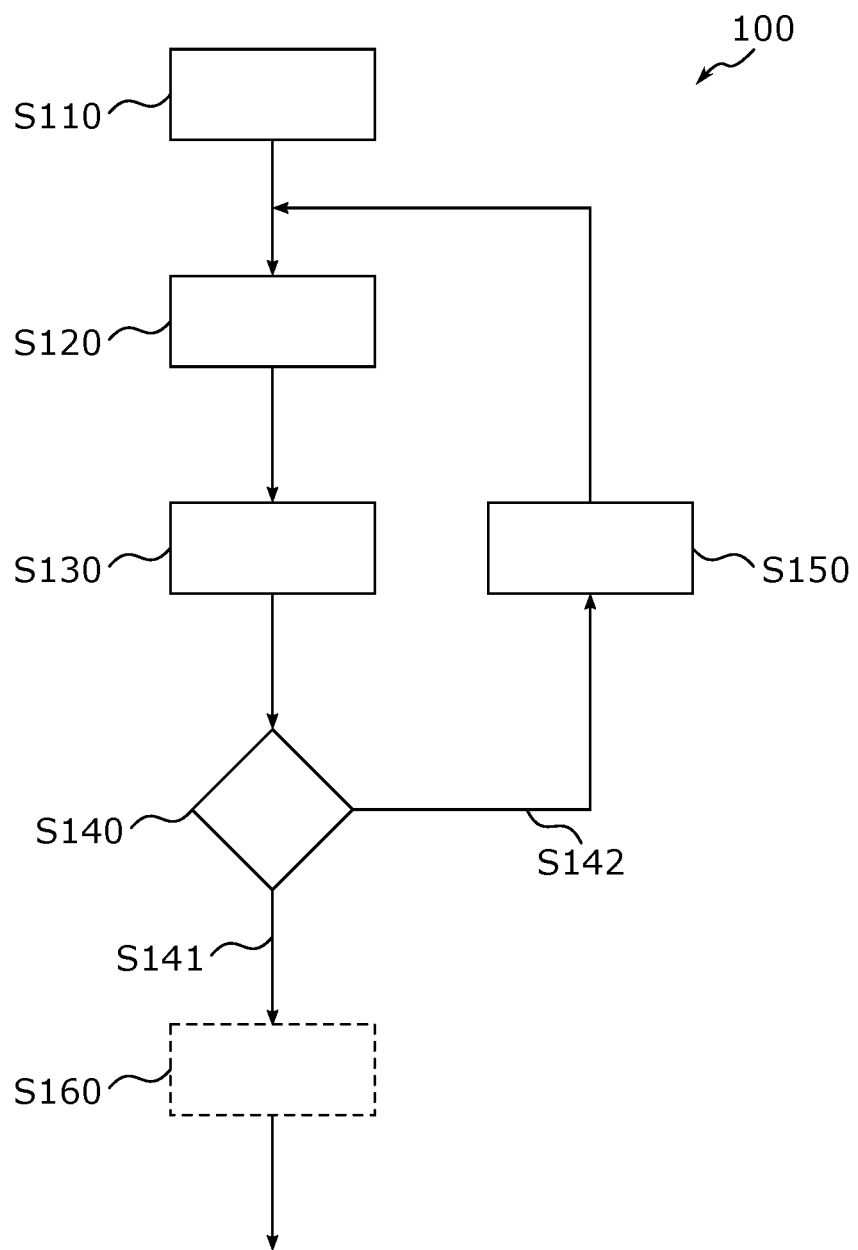
FIG. 1B schematically illustrates a step of the method of FIG. 1A, according to example embodiments.
FIG. 1C schematically illustrates a step of the method of FIG. 1A, according to example embodiments.
FIG. 1D schematically illustrates a step of the method of FIG. 1A, according to example embodiments.
FIG. 1E schematically illustrates a step of the method of FIG. 1A, according to example embodiments.
FIG. 1F schematically illustrates a step of the method of FIG. 1A, according to example embodiments.
FIG. 1G schematically illustrates a step of the method of FIG. 1A, according to example embodiments.
FIG. 1H schematically illustrates a step of the method of FIG. 1A, according to example embodiments.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may be exaggerated for illustrative purposes and, thus, are provided to illustrate the general structures of the embodiments.

DETAILED DESCRIPTION

Example embodiments of a method (or process) according to the present disclosure will now be described more fully hereinafter with reference to the accompanying drawings. The drawings show example embodiments, but the described methods may, however, be embodied in many different forms and should not be construed as limited to the embodiments set forth herein; rather, these embodiments are provided for thoroughness and completeness, and to fully convey the scope of the present disclosure.

With reference to FIGS. 1A to 1H, embodiments of a method for creating an interdigitated pattern for an interdigitated back-contact solar cell according to the present disclosure are described in the following.

FIG. 1A illustrates schematically a flowchart of a method 100. FIGS. 1B to 1H illustrate schematically various steps of the method 100.

Figure 1B:
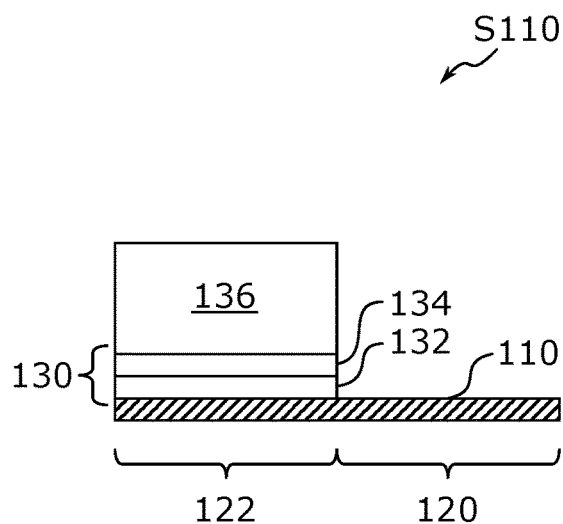

In a first step S110 (as illustrated in FIGS. 1A and 1B), a substrate 110 (e.g. a crystalline and/or semiconductor substrate) of the solar cell is provided. The substrate 110 may for example be a crystalline silicon substrate, but it is envisaged also that other types of substrates (such as a GaAs substrate) may be used. The substrate 110 has one or more exposed regions 120 (i.e., the surface of the substrate 110 in those regions are exposed and not covered by additional structures). The substrate 110 also has one or more other regions 122 which are covered by a patterned first passivation layer stack 130. The first passivation layer stack 130 may for example include an intrinsic a-Si (or a-Si:H) layer 132 and a doped a-Si (or a-Si:H) layer 134. The doping type may be of e.g. n-type or p-type. The patterned first passivation layer stack 130 is in turn covered by a hard mask 136, which has been used e.g. to pattern the first passivation layer stack 130. The hard mask 136 may for example be of silicon oxide ($SiO_x$), silicon nitride ($SiN_x$), aluminum (Al), aluminum oxide ($Al_2O_3$), zinc oxide (ZnO) or other suitable materials.

To form the interdigitated pattern of the solar cell, the method 100 will proceed by selectively depositing a second passivation layer stack. The interdigitated pattern will be formed by the first passivation layer stack 130 and the second passivation layer stack, as will be described later herein. As illustrated in FIG. 1H, the second passivation layer stack 140 will include a first layer 142. It is also envisaged that the second passivation layer stack 140 may include additional layers, such as for example a second layer 144 created on top of the first layer 142. The first layer 142 may for example be an intrinsic a-Si (or a-Si:H) layer, and the second layer 144 may for example be a doped a-Si (or a-Si:H) layer with a doping type opposite to that of the doped a-Si layer 134 of the first passivation layer stack 130. The selective deposition of the second passivation layer stack 140 will now be described in more detail.

Figure 1C:
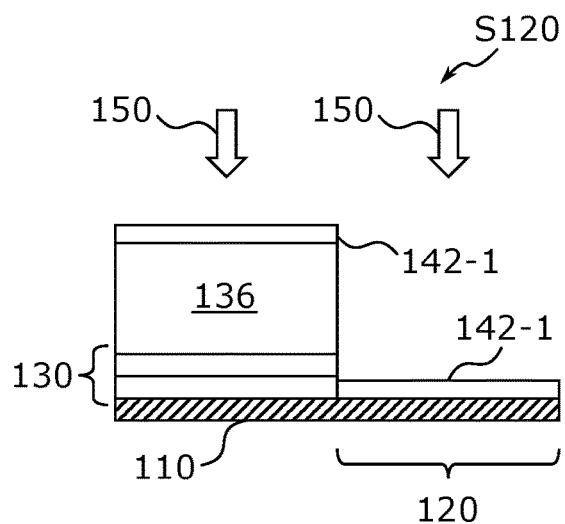

In a step S120 (as illustrated in FIGS. 1A and 1C), the method 100 continues by depositing a sublayer 142-1 of the first layer 142. The sublayer 142-1 is deposited/added both on the hard mask 136 and on the one or more exposed regions 120 of the substrate 110. The deposition of the sublayer 142-1 is carried out using a plasma deposition process, as illustrated by the arrows 150 in FIG. 1C. In some embodiments, the plasma deposition process used in the step S120 may for example be a PECVD process and include the use of e.g. $H_2$ and $SiH_4$. The plasma may be ignited during a plasma ignition phase, at a power density of for example 135 $mW/cm^2$ or similar. The plasma ignition phase may be followed by a deposition phase at a lower power density (e.g. around 20-45 $mW/cm^2$). In some embodiments, it is envisaged that $SiH_4$ may be introduced into the deposition chamber only after the plasma ignition phase has completed, and that a delay may be introduced between the plasma ignition phase and the deposition phase of the plasma deposition process. This may for example reduce a concentration of Si—$H_2$ in the deposited a-Si layer, and provide an improved passivation quality and longer (minority) carrier lifetime. For example, only $H_2$ may be introduced during the ignition phase, at a power of approximately 300 W. After a delay of for example 1 to 5 seconds, $SiH_4$ may be introduced into the chamber, and deposition of a-Si may take place at a power density of for example 20 to 45 $mW/cm^2$, such as for example 25 to 32 $mW/cm^2$, such as for example 27 $mW/cm^2$. By forming/depositing the a-Si only during the lower power deposition phase, the passivation quality may be improved and carrier lifetimes made longer. The deposition thickness of the added sublayer 142-1 may for example be between 3 to 10 nm, such as for example 5 nm.

Figure 1D:
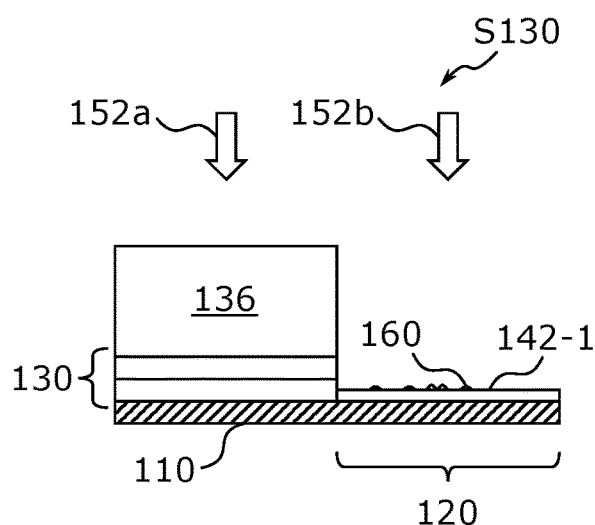

The method 100 may then proceed to a next step S130 (as illustrated in FIGS. 1A and 1D), wherein a plasma etch process (as illustrated by the arrows 152a and 152b) is used to remove the sublayer 142-1 from the hard mask 136. An etch rate of the etching 152a of the added sublayer 142-1 on the hard mask 136 may be higher than an etch rate of the etching 152b of the added sublayer 142-1 on the one or more exposed regions 120. Once substantially all of the added sublayer 142-1 has been removed from the hard mask 136, the etching 152a and 152b is stopped. Due to the lower etching rate of the added sublayer 142-1 in the one or more exposed regions 120, a finite thickness of the added sublayer 142-1 will remain in the one or more exposed regions 120. After the etching, there may be contaminants 160 which remain at least on the surface of the remaining added sublayer 142-1 in the one or more exposed regions 120. Contaminants 160 remaining after the etching step may negatively affect the passivation quality (i.e. reduce the passivation quality). There may also be such contaminants (not shown) remaining on the hard mask 136. The plasma etch process 152a and 152b may for example use $NF_3$/Ar as an etching precursor, which may prevent or at least reduce the induction of a defective polycrystalline layer which may be present if using e.g. $H_2$ as the etching precursor. The use of $NF_3$/Ar may help to obtain a selectively deposited pure a-Si layer on the substrate, thereby further improving e.g. carrier lifetime. Other usable etching precursors include for example $CF_x$ (such as e.g. $CF_4$ and $C_2F_6$), HBr/$Cl_2$, HBr/$O_2$ and/or $SF_6$/$O_2$. The amount of etching during the plasma etch process may depend on the thickness of the deposited sublayer 142-1. For example, etching may be performed such that 2 nm or less (but still at least 0.5 nm or more) of the sublayer 142-1 remains on the one or more exposed regions 120 after the etching is stopped. As an example, if 5.5 nm of a-Si is deposited (after a deposition time of e.g. 30 seconds), approximately 4.2 nm may be etched in 10 seconds using $NF_3$/Ar gas mixtures of approximately 25 sccm/75 sccm with pressure of 2.3 mbar, power density of 115 $mW/cm^2$ and at a temperature of approximately 175° C. It should, of course, be noted that the parameters may depend on the particular equipment used, and that other parameter values may then be used in order to achieve the same results. The same applies to all process parameter values given as examples herein, if not stated to the contrary.

After etching, the method 100 moves to an evaluation step S140 wherein a thickness of the first layer 142 deposited so far is evaluated, and compared with a desired thickness of the final first layer 142. After only a single depositing and etching, it is likely that the thickness of the first layer 142 is not yet sufficient, and the method 100 may then proceed along S142 to reiterate the depositing step S120 and etching step S130 at least one more time. If, on the other hand, it is determined that the thickness of the first layer 142 matches the desired thickness, the method 100 may exit the reiteration loop and instead continue along S141. It is also envisaged that it may be decided in advance how many iterations will be used, and that the evaluation step S140 may then be replaced with a counting step which simply forces the method to go back in the iterative loop a predefined number of times, before proceeding towards S141. Likewise, the thickness of the first layer 142 may be decided in any suitable way. The thickness may be actually measured, or it may be envisaged that the thickness is estimated based on for example gas flow rates, times and power used during the deposition and/or etching steps.

Figure 1E:
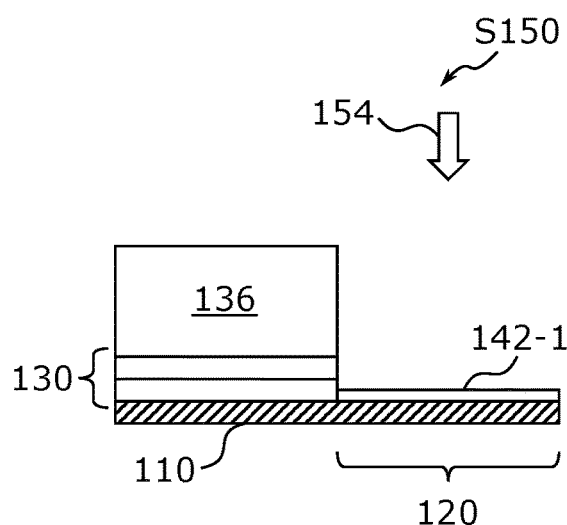
Figure 1H:
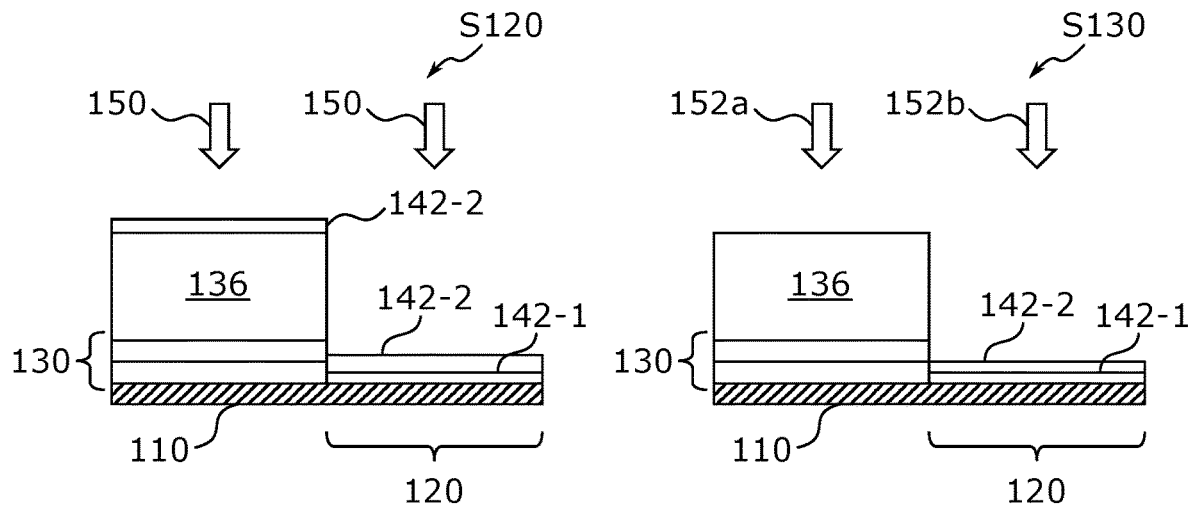
Figure 1H:
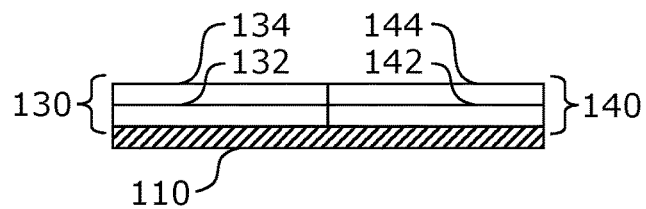

If it is decided that further deposition and etching is to be performed (e.g. by looking at the present thickness, or by counting the number of iterations so far), the method 100 may perform a plasma cleaning step S150 (as illustrated in FIGS. 1A and 1E). The plasma cleaning process (as illustrated by the arrow 154) may be used to clean the surface of the remaining added sublayer 142-1 from the contaminants 160 remaining after the etching step S130. The plasma cleaning process 154 may for example be an $H_2$ plasma cleaning process. Other cleaning precursors may for example be Ar, $N_2O/NH_3$ and $O_2/NH_3$. The cleaning time may for example be between 10 to 30 seconds, such as for example 20 seconds. Shorter times may lead to insufficient cleaning, and longer times may result in damage to the deposited a-Si induced by the $H_2$ plasma. A cleaning power may for example be 200 W or more, depending on the exact equipment used. For example, a cleaning power density may correspond to 90 $mW/cm^2$ or more. The power density may be adapted to be sufficient to remove e.g. fluorine contaminations remaining on the surface of the added sublayer 142-1 after the etching step S130. The plasma cleaning process may be a dry process, that does not require the use of wet chemicals (such as for a HF dip). In addition to providing an improved passivation and carrier lifetime, the plasma cleaning process may be performed in-situ without breaking a vacuum, and within the same chamber as used for the plasma deposition and etching steps. This may for example improve the industrial applicability of the method. The cleaning process may also clean the surface of the hard mask 136.

After cleaning, the steps of deposition S120 and etching S130 may be performed again, to further increase the thickness of the first layer 142. One iteration of the steps S120 and S130 is shown in FIGS. 1F and 1G. In FIG. 1F, an additional sublayer 142-2 is deposited on the hard mask 136 and on the remaining previously deposited sublayer 142-1 of the first layer 142, by using the deposition process illustrated by the arrows 150. The deposition process 150 may be similar or equal to the deposition process used in the previous execution of step S110 leading to the deposition of the sublayer 142-1. Next, as illustrated in FIG. 1G, the etching step S130 is repeated such that the sublayer 142-2 is substantially removed from the hard mask 136, while a finite thickness of the sublayer 142-2 remains on the previous sublayer 142-1 in the one or more exposed regions 120.

As illustrated in FIG. 1G, the total thickness of the first layer 142 may then be determined (in step S140) to match a desired thickness of the first layer 142, and the method 100 may exit the iteration loop. It is, although not illustrated here, envisaged that further iterations may be used if a larger thickness of the first layer 142 is desired. A desired thickness of the first layer 142, e.g. if being an intrinsic a-Si layer, may for example be from 3 to 10 nm. There may be contaminants (of e.g. fluoride) left on the surface of the additional sublayer 142-2, but it is envisaged that such contaminants may (if desired) be removed in a subsequent cleaning step (not shown) as part of a full process of manufacturing the solar cell.

As illustrated in FIG. 1H, the second passivation layer stack 140 may include also a second layer 144. As described earlier herein, the second layer 144 may for example have a doping type opposite to that of the doped a-Si layer 134 of the first passivation layer stack 130. A desired thickness of the second layer 144, e.g. if being a doped a-Si layer, may for example be from 5 to 35 nm. The second layer 144 may be selectively deposited on the first layer 142 using the same iterative method as described herein for the first layer 142. The hard mask 136 may be removed using suitable techniques, and the first passivation layer stack 130 and the second passivation layer stack 140 may form the interdigitated pattern of the solar cell.

In some embodiments of the method 100, as illustrated in FIG. 1A, the method 100 may include an annealing step S160 which is performed once the evaluation step S140 (or counting step) determines that the thickness of the deposited first layer 142 matches the desired thickness. An annealing temperature may for example be from 200 to 250° C. Gases used during annealing may for example include $N_2$, $N_2/H_2$, $H_2$ or air. It is envisaged that, in some embodiments of the method, the annealing may be performed after each layer of the second passivation layer stack 140 has been selectively deposited, but also that the annealing is performed only when all layers (e.g. both the first layer and the second layer) of the second passivation layer stack 140 have been selectively deposited. Annealing of the first layer 142 and/or the second layer 144 (if present) may further improve passivation quality and carrier lifetime. It is envisaged also that a temperature of annealing may depend on how many, and also what types of, layers that are to be annealed. For example, if only the first layer 142 (which may be e.g. an intrinsic a-Si layer) of the second passivation layer stack 140 is present, an annealing temperature may for example be from 200 to 250° C. If also the second layer 144 (which may be e.g. a doped a-Si layer) is present, annealing may for example be performed at a temperature from 150 to 200° C.

The method disclosed herein may provide an improved way of selectively depositing the second passivation layer stack, which when combined with the first passivation layer stack may create the interdigitated pattern used for interdigitated back-contact solar cells. By combining iterative deposition, etching with different etch rates and intermediate cleaning, the method may provide sufficient selectivity of the deposition (i.e. such that no or very little material remains e.g. on top of the hard mask used to pattern the first passivation layer stack), while also providing sufficient surface passivation (of e.g. crystalline silicon, c-Si) and sufficient (minority) carrier lifetimes.

Although features and elements are described above in particular combinations, each feature or element may be used alone without the other features and elements or in various combinations with or without other features and elements. The same applies to methods and individual method steps, which may be used alone or in combination also in other order if not explicitly indicated otherwise.

Additionally, variations to the disclosed embodiments can be understood and effected from a study of the drawings, the disclosure, and the appended claims. Even if certain aspects of the present disclosure have mainly been described with reference to a limited number of examples/embodiments, it is readily appreciated that other examples than the ones disclosed above are equally possible within the scope of such aspects, as defined by the appended claims.

In the claims, the word "comprising" does not exclude other elements, and the indefinite article "a" or "an" does not exclude a plurality. The mere fact that certain features are recited in mutually different dependent claims does not indicate that a combination of these features cannot be used.

What is claimed is:

1. A method for creating an interdigitated pattern for a solar cell, comprising:
   providing a substrate of the solar cell, wherein a surface of the substrate includes one or more exposed regions and one or more regions covered by a patterned first passivation layer stack protected by a hard mask; and
   selectively depositing a second passivation layer stack comprising at least a first layer of amorphous silicon (a-Si) on the one or more exposed regions such that the first passivation layer stack and the second passivation layer stack form the interdigitated pattern,
   wherein selectively depositing the second passivation layer stack comprises:
   1a) adding, using a plasma deposition process, a sublayer of the first layer on the hard mask and in the one or more exposed regions of the surface;
   1b) etching, using a plasma etch process, the added sublayer on the hard mask and in the one or more exposed regions, wherein an etch rate of the added sublayer on the hard mask is higher than an etch rate of the added sublayer in the one or more exposed regions, thereby substantially removing the added sublayer from the hard mask and leaving a finite thickness of the added sublayer in the one or more exposed regions; and
   1c) cleaning, using a plasma cleaning process, a surface of the remaining added sublayer in the one or more exposed regions from contaminants remaining from the plasma etch process, and adding a further sublayer of the first layer in the one or more exposed regions by repeating steps 1a) and 1b),
   wherein step 1c) is repeated until a desired thickness of the first layer in the one or more exposed regions is obtained.

2. The method of claim 1, further comprising thermally annealing the first layer after obtaining the desired thickness of the first layer.

3. The method of claim 2, wherein a temperature of the annealing is from 200 to 250° C.

4. The method of claim 1, wherein, after etching in step 1b), the finite thickness of the remaining added sublayer in the one or more exposed regions is 2 nm or less.

5. The method of claim 1, wherein, after etching in step 1b), the finite thickness of the remaining added sublayer in the one or more exposed regions is 0.5 nm or more.

6. The method of claim 1, wherein the plasma deposition process comprises delaying deposition of a-Si until after the plasma has been ignited.

7. The method of claim 6, wherein the delay of the a-Si deposition is from 1 to 5 seconds.

8. The method of claim 1, wherein the plasma deposition process comprises using a $SiH_4$ precursor.

9. The method of claim 1, wherein the desired thickness of the first layer in the one or more exposed regions is from 3 to 10 nm.

10. The method of claim 1, wherein the plasma etch process comprises using a precursor selected from the group consisting of: $NF_3/Ar$, $CF_x$, $HB_r/Cl_2$, $HBr/O_2$, and $SF_6/O_2$.

11. The method of claim 1, wherein a time duration of the cleaning is from 10 to 30 seconds.

12. The method of claim 1, wherein a power density used for the cleaning is at least 90 mW/cm$^2$.

13. The method of claim 1, wherein the plasma cleaning process includes using a precursor selected from the group consisting of: $H_2$, Ar, $N_2O/NH_3$, and $O_2/NH_3$.

14. The method of claim 1,
   wherein the first layer of a-Si is a first layer of intrinsic a-Si,
   wherein the second passivation layer stack comprises a second layer of doped a-Si,
   wherein selectively depositing the second passivation layer stack further comprises:
   2a) adding, using a plasma deposition process, a sublayer of the second layer on the hard mask and on the first layer in the one or more exposed regions;
   2b) etching, using a plasma etch process, the added sublayer of the second layer on the hard mask and on the first layer in the one or more exposed regions, wherein an etch rate of the added sublayer of the second layer on the hard mask is higher than an etch rate of the added sublayer of the second layer on the first layer in the one or more exposed regions, thereby substantially removing the added sublayer of the second layer from the hard mask and leaving a finite thickness of the added sublayer of the second layer on the first layer in the one or more exposed regions; and
   2c) cleaning, using a plasma cleaning process, a surface of the remaining added sublayer of the second layer on the first layer in the one or more exposed regions from contaminants remaining from the plasma etch process, and adding a further sublayer of the second layer on the first layer in the one or more exposed regions by repeating steps 2a) and 2b),
   wherein step 2c) is repeated until a desired thickness of the second layer on the first layer in the one or more exposed regions is obtained.

15. The method of claim 14, wherein the desired thickness of the second layer on the first layer in the one or more exposed regions is from 5 to 35 nm.

* * * * *